United States Patent [19]
Möller et al.

[11] Patent Number: 5,084,685
[45] Date of Patent: Jan. 28, 1992

[54] MICROCOMPUTER HAVING AN INTEGRATED RC OSCILLATOR WITH PROGRAMMABLE FREQUENCY

[75] Inventors: Udo Möller, Duisburg; Martin Renner, Mettmann, both of Fed. Rep. of Germany

[73] Assignee: Siemens Aktiengesellschaft, Munich, Fed. Rep. of Germany

[21] Appl. No.: 616,875

[22] Filed: Nov. 21, 1990

[30] Foreign Application Priority Data

Nov. 21, 1989 [EP] European Pat. Off. ......... 89121534.5

[51] Int. Cl.$^5$ ..................... H03L 7/181; H03K 3/295
[52] U.S. Cl. ................... 331/1 A; 331/36 C; 331/108 C; 331/111; 331/143; 331/179
[58] Field of Search .............. 331/1 A, 2, 16, 36 C, 331/44, 108 C, 111, 143, 177 R, 179

[56] References Cited

U.S. PATENT DOCUMENTS

| | | | |
|---|---|---|---|
| 3,895,315 | 7/1975 | Way | 331/111 |
| 4,652,837 | 3/1987 | D'Arrigo et al. | 331/111 |
| 4,667,168 | 5/1987 | Shiomi et al. | 331/1 R |
| 4,723,114 | 2/1988 | D'Arrigo et al. | 331/111 |
| 4,814,640 | 5/1989 | Miyake | 307/303 |
| 4,816,776 | 5/1989 | Kessler | 331/49 |
| 4,868,525 | 9/1989 | Dias | 331/111 |

FOREIGN PATENT DOCUMENTS 8502275  5/1985  PCT Int'l Appl. .

OTHER PUBLICATIONS

Philips Laboratory Report of the Central Application Laboratory CAB, Number DPE87221 of Nov. 16, 1987; J. C. P. M. Pijnenburg "PCF84C640 Spec. Version 1.0".
Mitsubishi Microcomputers M50433B-XXXSP by Mitsubishi Electric.
U. Tietze et al: "Semiconductor Circuit Technology", 8th Printing, 1986, p. 177, FIG. 8.31.

*Primary Examiner*—David Mis
*Attorney, Agent, or Firm*—Herbert L. Lerner; Laurence A. Greenberg

[57] ABSTRACT

A monolithically integrated microcomputer clocked at a processor clock rate includes a clock generator in the form of an RC oscillator being synchronizable by external signals for controlling at least one functional unit operating asynchronously with the processor clock rate. The RC oscillator has a frequency-determining resistor and a frequency-determining capacitor being monolithically integrated. The frequency-determining capacitor is formed of a plurality of switchable capacitors to be interconnected to make a total capacitor with a variable size. Registers are each connected to a respective one of the capacitors for defining a switching state of the switchable capacitors. A central processing unit is connected to the registers for adjusting the frequency of the clock generator by setting the registers.

6 Claims, 1 Drawing Sheet

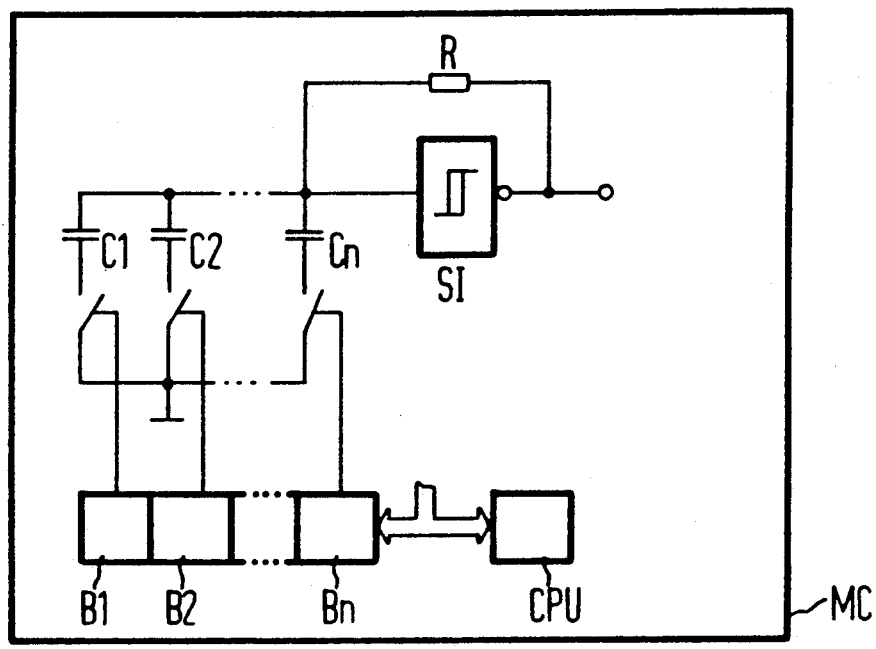

MICROCOMPUTER HAVING AN INTEGRATED RC OSCILLATOR WITH PROGRAMMABLE FREQUENCY

BACKGROUND OF THE INVENTION

1. Field of the Invention

The invention relates to a monolithically integrated microcomputer being clocked at a processor clock rate, including a central processing unit and at least one functional unit operating asynchronously with the processor clock rate and being controlled by a clock generator that is synchronizable by external signals, the clock generator being in the form of an RC oscillator.

2. Description of the Related Art

Such a computer is needed if it is not only to perform the usual functions of a microcomputer, but also to incorporate text and graphics into an RGB video signal, such as a television picture. Microcomputers which are known for such a purpose use an RC oscillator, with an integrated Schmitt trigger but an externally wired frequency-determining capacitor and feedback resistor. A multivibrator having an inverting Schmitt trigger is known, among other sources, from the book Halbleiter-Schaltungstechnik ÄSemiconductor CircuitryÜ, by U. Tietze and C. Schenk, 8th Ed., 1986, page 177, FIG. 8.31, and the description of that figure. The output of an inverting Schmitt trigger therein forms the output of the oscillator and is fed back to the input of the Schmitt trigger through a frequency-determining resistor. The input of the Schmitt trigger is also connected through a frequency-determining capacitor to a ground potential.

SUMMARY OF THE INVENTION

The article entitled PCF84C640 specification, version 1.0 by J.C.P.M. Pijnenburg, published in the Philips Laboratory Report Number DPE 87221 of Nov. 16, 1987, discloses a generic microcomputer. In particular, attention is directed to page R21, FIG. 20 thereof, which shows a functional unit operating asynchronously with the processor clock rate and being controlled by a clock generator that is synchronizable by external signals, in this case a DOS (Display On Screen) unit. The microcomputer shown therein includes an RC oscillator having an externally connected serial RC member. The connecting node between the resistor and the capacitor of that external RC member is connected to the integrated microcomputer. The resistor of the RC member is interconnected to the supply potential of the microcomputer and the capacitor of the RC member is connected to the ground potential of the microcomputer.

The Mitsubishi Electric data sheet on the Mitsubishi microcomputer model M50433B-XXXSP discloses a microcomputer of this generic type in which the output of an RC oscillator is fed back to its input through an externally connectable, variable resistor, and the input of the RC oscillator is connected through a capacitor to the ground potential of the microcomputer.

In such known microcomputers, the oscillator frequency is determined directly by the parameters of the external resistor and the external capacitor. Fluctuations in the parameters, which may arise from model variations, temperature dependency or aging, can cause an undesirable change in the frequency. In order to achieve a defined operating frequency, suitable tuning provisions are necessary when the equipment is manufactured. In order to connect the external switch elements, at least one contact is also necessary, which becomes a problem both in terms of the required chip area and the price of the necessary housing.

It is accordingly an object of the invention to provide a monolithically integrated microcomputer having an integrated RC oscillator with a programmable frequency, which overcomes the hereinafore-mentioned disadvantages of the heretofore-known devices of this general type, which is clocked at a processor clock rate, which has a central processing unit and at least one functional unit operating asynchronously with the processor clock rate and being controlled by a clock generator that is synchronizable by external signals, and in which the clock generator is in the form of an RC oscillator.

With the foregoing and other objects in view there is provided, in accordance with the invention, a monolithically integrated microcomputer clocked at a processor clock rate, comprising a clock generator in the form of an RC oscillator being synchronizable by external signals for controlling at least one functional unit operating asynchronously with the processor clock rate; the RC oscillator having a frequency-determining resistor and a frequency-determining capacitor being monolithically integrated; the frequency-determining capacitor being formed of a plurality of switchable capacitors having means for interconnecting the switchable capacitors to make a total capacitor with a variable size; corresponding registers each being connected to a respective one of the interconnecting means for defining a switching state of the switchable capacitors; and a central processing unit connected to the registers for adjusting the frequency of the clock generator by setting the registers.

In a microcomputer according to the invention, no component located outside the microcomputer, which would thus require a connection pad on the semiconductor chip for connecting it to the microcomputer, is needed in order to adjust the frequency of the clock generator which is synchronizable by external signals. Since in modern semiconductor technology the size of the semiconductor chip is definitively set by the number of connection pads, a microcomputer according to the invention requires less chip area, despite having more circuitry, when compared with a microcomputer having an external RC member.

A major advantage of microcomputers according to the invention as compared with those of the prior art is that manual frequency tuning is unnecessary, and parameter fluctuations due to changes in temperature or aging do not negatively affect the frequency tuning. Moreover, the frequency of the clock generator can be varied during operation of the microcomputer.

In an advantageous exemplary embodiment of a microcomputer according to the invention, the frequency tuning of the clock generator, which is synchronizable by external signals, is performed in the context of a test cycle. The counter of a central processing unit counts the number of pulses of the clock generator during a defined period of time. Based on the outcome of the counting, and taking into account the prior contents of registers and thus the prior total capacitance, the central processing unit then calculates the register contents required and sets registers that accordingly define the switching state of switchable capacitors.

According to an advantageous exemplary embodiment, the period of time during which the pulses of the clock generator are counted is set as a function of the processor clock rate. Therefore, in accordance with another feature of the invention, the processor clock rate is provided as a reference for the frequency adjustment of the clock generator.

Naturally, one skilled in the art will readily understand that the clock generator frequency can also be varied by varying the frequency-determining resistor at the RC oscillator. It is therefore equivalent to the description of the invention given above, if the frequency-determining resistor includes a plurality of switchable subresistors, which can be interconnected as needed.

In accordance with a further feature of the invention, the switchable capacitors have different capacitances. In accordance with an added feature of the invention, the switchable capacitors are connected parallel to one another. The parallel connection of variously sized capacitors provides a particularly advantageous embodiment which saves chip space.

In accordance with an additional feature of the invention, the RC oscillator includes a Schmitt trigger inverter having an input and an output being fed back through the resistor, and the switchable capacitors are switched between the input of the Schmitt trigger inverter and ground potential.

In accordance with yet another feature of the invention, the switching state of each of the switchable capacitors depends on the data content of a special register.

In accordance with a concomitant feature of the invention, there is provided a decoder through which the switchable capacitors are triggered by the registers, and means for assigning a special total capacitance to any conceivable combination of register contents.

Other features which are considered as characteristic for the invention are set forth in the appended claims.

Although the invention is illustrated and described herein as embodied in a microcomputer having an integrated RC oscillator with a programmable frequency, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the drawing.

BRIEF DESCRIPTION OF THE DRAWING

The drawing is a basic schematic and block circuit diagram of a microcomputer according to the invention.

DESCRIPTION OF THE PREFERRED EMBODIMENT

Referring now to the single figure of the drawing in detail, there is seen a part of the circuitry of an exemplary embodiment which is essential to the invention and is described in detail below. The circuit diagram of the drawing shows a microcomputer MC, but most of the components of a microcomputer of this generic type, which are known from the references mentioned above among other sources, have been left out for the sake of simplicity. What is shown is an RC oscillator of a clock generator according to the invention, including a Schmitt trigger inverter SI, having an output which forms the output of the RC oscillator. The output of the Schmitt trigger oscillator SI is fed back to its input through a resistor R. Additionally, the input of the Schmitt trigger oscillator SI is connectable to ground potential through a plurality of parallel-connected switchable capacitors $C_1, C_2, \ldots, C_n$. The control input of the switch of each of the switchable capacitors $C_1, C_2, \ldots, C_n$ is connected to a respective register $B_1, B_2, \ldots, B_n$. The switch position depends on the register contents. A central processing unit CPU is also shown, which among other functions can read the contents of the aforementioned registers $B_1, B_2, \ldots, B_n$ and can also vary them.

In the circuit shown in the drawing, the frequency adjustment of the RC oscillator can be performed through the registers $B_1, B_2, \ldots, B_n$ by means of the central processing unit CPU. The processor clock rate, which is generated, for instance, by a quartz oscillator or a surface wave filler oscillator, can serve as a reference in this process. Through the use of repeated automatic tuning during operation, variations in frequency of the RC oscillator which may, for instance, be caused by temperature fluctuations, can be balanced out. For this reason, production-dictated deviations of the frequency-determining resistor or of the various frequency-determining capacitors likewise have no effect.

We claim:

1. Monolithically integrated microcomputer clocked at a processor clock rate, comprising a clock generator in the form of an RC oscillator for controlling at least one functional unit operating asynchronously with the processor clock rate; said RC oscillator having a frequency-determining resistor and a frequency-determining capacitor being monolithically integrated; said frequency-determining capacitor being formed of switchable capacitors each having means for interconnecting said switchable capacitors to make a total capacitor with a variable size; registers each being connected to a respective one of said interconnecting means for defining a switching state of said switchable capacitors; a central processing unit connected to said registers for adjusting the frequency of said clock generator by setting said registers; said central processing unit having a counter connected to said clock generator for counting pulses of said clock generator during a defined period of time, and said central processing unit having means for calculating required register contents and for setting said registers in accordance therewith based on the number of pulses counted and on prior contents of said registers and on external signals for synchronizing said central processing unit.

2. Microcomputer according to claim 1, wherein the processor clock rate is provided as a reference for the defined period of time.

3. Microcomputer according to claim 1, wherein said switchable capacitors have different capacitances.

4. Microcomputer according to claim 1, wherein said switchable capacitors are connected parallel to one another.

5. Microcomputer according to claim 1, wherein said RC oscillator includes a Schmitt trigger inverter having an input and an output being fed back through said resistor, and said switchable capacitors are switched between the input of said Schmitt trigger inverter and ground potential.

6. Microcomputer according to claim 1, wherein the switching state of each of said switchable capacitors depends on the data content of a respective one of said registers.

* * * * *